(12) United States Patent
Buchwalter et al.

(10) Patent No.: US 6,879,098 B2
(45) Date of Patent: Apr. 12, 2005

(54) DISPLAY FABRICATION USING MODULAR ACTIVE DEVICES

(75) Inventors: Stephen L. Buchwalter, Hopewell Junction, NY (US); Evan G. Colgan, Chestnut Ridge, NY (US); Sung Kwon Kang, Chappaqua, NY (US); Robert L. Wisnieff, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/756,037

(22) Filed: Jan. 13, 2004

(65) Prior Publication Data

US 2004/0140763 A1 Jul. 22, 2004

Related U.S. Application Data

(62) Division of application No. 09/749,080, filed on Dec. 27, 2000, now Pat. No. 6,698,077.

(51) Int. Cl.$^7$ ................................................ H01J 1/62
(52) U.S. Cl. ...................................... 313/500; 313/495
(58) Field of Search ................................ 313/495–497, 313/528–587, 500–512

(56) References Cited

PUBLICATIONS

Doany et al., Laser Release Process to Obtain Freestanding Multilayer Metal–Polyimide Circuit: of Research and Development, vol. 41, No. 1/2, Jan./Mar. 1997, pp. 151–157.

Jokerst et al., "Epitaxial Liftoff of GaAs Detectors Onto Silicon Integrated Circuits", IEEE L: Electro–Optics Society 1993 Annual Meeting Leos '93 Conference Proceedings, 1993, pp. 664–665, no month.

Wilkinson et al., "Integration of Thin Film Compound Semiconductor Photonic Devices Onto Micro: Platforms", see http://www.ece.gatech.edu/research/labs/iorg/Abstracts/MOMSJapan.html.

Jokerst et al., "Thin–Film Multimaterial Optoelectronic Integrated Circuits", IEEE Transaction: Packaging, and Manufacturing Technology, Part B, vol. 19, No. 1, Feb. 1996, pp. 97–106.

Brooke et al., "Silicon CMOS optical receiver circuits with integrated thin–film compound semi–devices", Proc. of SPIE—International Society for Optical Engineering, vol. 2400, 1995, pp.

Jokerst et al., "Thin Film Multi–Material OEICs", Proc. IEEE Lasers and Electro–Optics Soc. 19: LEOS '94 Conference Proceedings, vol. 1, 1994, pp. 69–70, no month.

Camperi–Ginestet et al., "Vertical Electrical Interconnection of Compound Semiconductor Thin–F. Underlying Silicon Circuitry", IEEE Photonics Technology Letters, vol. 4, No. 9, Sep. 1999.

(Continued)

Primary Examiner—Joseph Williams
(74) Attorney, Agent, or Firm—Robert M. Trepp (57) ABSTRACT

A method for fabricating a display device patterns a conductive layer on a display substrate and forms pixel electrodes on the display substrate. A plate is employed for carrying separately fabricated active devices to the display substrate. The separately fabricated devices are connected to the conductive layers and the pixel electrode.

8 Claims, 9 Drawing Sheets

OTHER PUBLICATIONS

Jokerst et al., "Manufacturable Multi–Material Integration: Compound Semiconductor Devices Bon: Circuitry", SPIE—International Society for Optical Engineering, Jul. 1995, San Diego, Califo: pp. 152–163.

Alien Technology Corporation White Paper, "Fluidic Self Assembly", Oct. 1999, see: http://www.alientechnology/com/library/pdf/fsa white paper.pdf).

Kitahara et al., Invited Paper: Technology Trend of Large Size and High Resolution Direct–View '00 Digest, pp. 1108–1111, no month.

Inukai et al., 36.4L: Late–News Paper: 4.0–in. TFT–OLED Displays and a Novel Digital Driving Digest, pp. 924–927, no month.

Utsunomiya et al., 36.2: Low Temperature Poly–Si TFTs on Plastic Substrate Using Surface Free Laser Ablation/Annealing (SUFTLA) SID '00 Digest, pp. 916–919, no month.

Mizukami et al., "36.1:6–Bit Digital VGA OLED", SID '00 Digest, pp. 912–915, no month.

DISPLAY FABRICATION USING MODULAR ACTIVE DEVICES

CROSS-REFERENCE TO RELATED APPLICATION

This application is a Divisional of U.S. application Ser. No. 09/749,080 filed on Dec. 27, 2000 now U.S. Pat. No. 6,698,077, which is incorporated herein by reference.

BACKGROUND OF THE INVENTION

1. Field of the Invention

The present invention relates to display device fabrication, and more particularly to an apparatus and its fabrication methods which employ modular active devices which are separately fabricated from and assembled on a substrate.

2. Description of the Related Art

Flat panel displays, such as OLEDs (Organic Light Emitting Diodes) or AMLCDs (Active Matrix Liquid Crystal Displays), are currently manufactured in a process where the light emitting or transmitting elements are built simultaneously with active electrical devices and addressing electrodes. All these elements are formed in their final desired position on a common substrate. These active electrical devices are formed at each subpixel element of an array of subpixels. This approach has significant economic disadvantages in that the processing required for fabrication of the active electrical devices is much more complex than that required for fabrication of the pixel electrode for light emitting or transmitting elements and the addressing electrodes.

In one example, a passivated amorphous silicon thin film transistor (TFT) can be formed in four mask steps, and if the addressing lines do not include cross-overs and passivation is not required, then only two mask steps are required to pattern aluminum conductors and transparent Indium Tin Oxide (ITO) pixel electrodes for the light emitting or transmitting elements. In a typical direct view OLED or AMLCD display, the active electrical devices only occupy about 10% or less of the total substrate area.

Significant cost savings could be achieved if the active electrical devices could be fabricated separately from the substrate including the pixel electrodes and the addressing electrodes, and subsequently assembled onto the substrate including the pixel and the addressing electrodes if a low cost and compact joining technology was used.

One approach for assembling small pieces of silicon chips containing the active electrical devices onto a display substrate is fluidic self assembly described by Alien Technologies (See, http://www.alientechnology/com/library/pdf/fsa_white_paper.pdf). In this process, the display substrates are formed from plastic and include indentations where it is desirable to locate active electrical devices. The indentations match the shape of the small pieces of silicon chips. The small chips are suspended in a fluid which flows over the substrate and deposits the chips in the desired locations. Electrical connections are formed by depositing metal over the chips including the active electrical devices and the substrate and patterning the metal. This approach has significant disadvantages in that the indentations in the substrate and the small chips including the active electrical devices must be precisely shaped to match and there is no easy means of replacing the small chip including the active devices or reworking the electrical contact to the substrate if a small chip including the active devices is damaged during assembly and processing or an electrical contact fails.

Further, the precise shape of the small silicon chip including the active devices is achieved by photolithography in combination with anisotropic etching of single crystalline silicon, so expensive silicon wafers must be used for fabrication of the active devices.

Therefore, a need exists for an apparatus and method of fabrication which includes separately fabricated active devices integrated on a substrate for a display device for reducing costs and manufacturing complexity.

SUMMARY OF THE INVENTION

A method for fabricating a display device patterns a conductive layer on a display substrate and forms pixel electrodes on the display substrate. A plate is employed for carrying separately fabricated devices to the display substrate. The separately fabricated devices are connected to the conductive layers and the pixel electrode.

Another method for fabricating a display device, in accordance with the present invention includes the steps of providing a first substrate having chiplets formed in a pattern on a parting layer, attaching a first plate to a top side of the chiplets, separating the chiplets from the first substrate at the parting layer, attaching a back side of selected chiplets to a second plate and aligning and connecting the front side of the selected chiplets to a display substrate.

In other methods, the separately fabricated devices preferably include chiplets. The chiplets may include a transistor and/or a capacitor. The chiplets may include a cross-over connector which provides a connection between conductors formed on the display substrate. The method may include the steps of forming conductive attachments on the display substrate and the separately fabricated devices and aligning and connecting the separately fabricated devices with the display substrate by the conductive attachments. In still other embodiments, the conductive attachments on one of the display substrate and the separately fabricated devices may include at least one of solder bumps, conductive adhesive bumps and thermocompression bond pads. The plate carrying separately fabricated devices may include holes, and the method may further include the step of applying vacuum through the holes to carry the separately fabricated devices. The step of patterning a conductive layer on a display substrate may include patterning gate lines and data lines from the conductive layer. The method may include the step of removing a separately fabricated device from the display substrate. The method may include the step of disengaging the separately fabricated devices from the plate.

A display device includes gate lines and data lines patterned from a single layer of conductive material. Pixel electrodes are formed in operative relationship with the gate lines and data lines. A plurality of chiplets are connected to the gate lines, the data lines and the pixel electrodes such that the chiplets activate the pixel electrodes in accordance with the gate lines and the data lines.

In other embodiments, the display device may include an active matrix liquid crystal display or an organic light emitting diode display. The plurality of chiplets may be connected to the gate lines, the data lines and the pixel electrodes by conductive attachments. The conductive attachments may include at least one of solder bumps, conductive adhesive bumps and thermocompression bond pads. The plurality of chiplets may provide a cross-over connection between data lines. The chiplets may each include a transistor which is connected to at least a data line and a gate line. The chiplets may each include a storage capacitor. The chiplets may include a size related to a fraction of sub-pixel size for sub-pixels of the display device.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

The present invention fabricates active electrical devices separately from display substrates. These active electrical devices will be referred to hereinafter as chiplets. Each chiplet includes active electrical devices, etc. for each single subpixel, a portion of a sub-pixel or a group of immediately adjacent subpixels and connections for connecting the chiplet to the display substrate, such as bondable metallurgical pads, conductive adhesive bumps or micro-solder bumps and interconnections to connect the chiplet to the display substrate. Advantageously, chiplets of the present invention include micro-solder bumps or other connections to provide points of electrical attachment and to align and join multiple chiplets to the display substrate.

One significant advantage of micro-solder bumps includes that the individual chiplets are reworkable and that if the solder is melted, the surface tension of solder columns provides precise self-alignment between the chiplet and the display substrate. An additional advantage is that the chiplets may be fabricated using inexpensive polycrystalline or amorphous silicon films. Additionally, for a light emitting display which emits light through a transparent display substrate, the light emitting area of the display is limited only by the area needed for addressing electrodes and joining pads, not by the area of the chiplets having the active devices which can extend over portions of the light emitting area.

Figure 1:
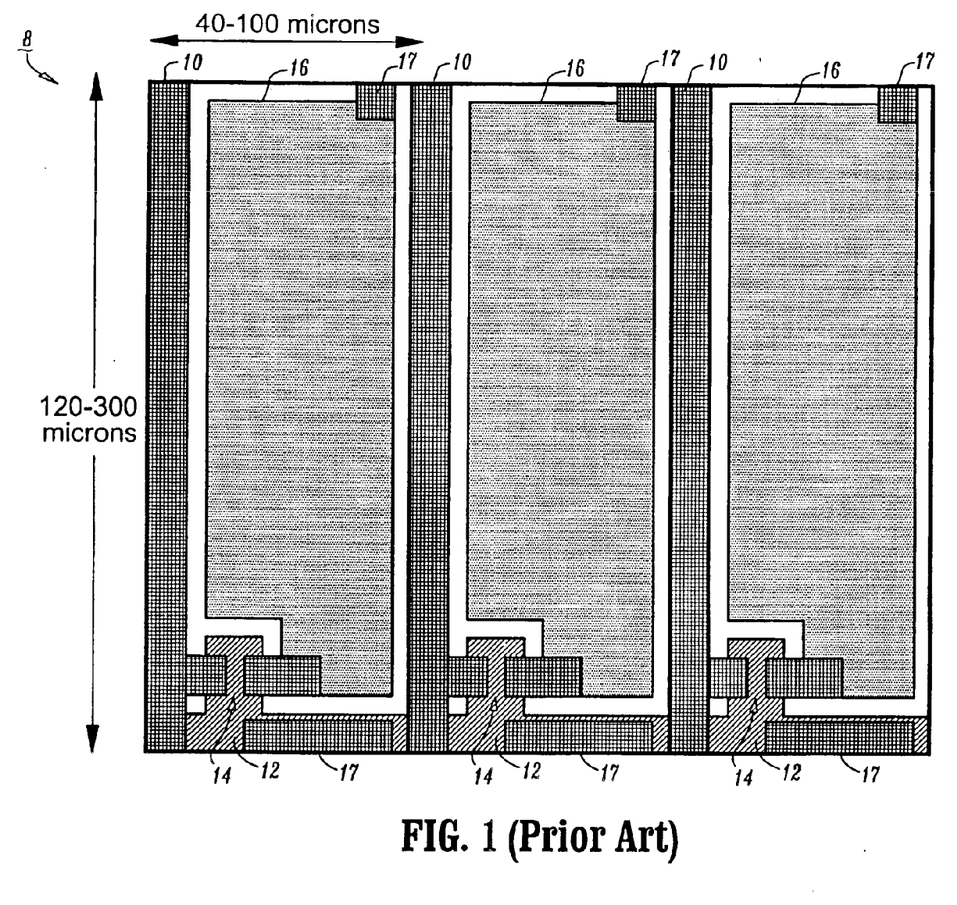
FIG. 1 is a top schematic view of a flat panel display with active devices integrally formed at each subpixel in accordance with the prior art.

Referring now in detail to the figures in which like numerals represent the same or similar elements and initially to FIG. 1, a schematic of a conventional TFT array for an AMLCD is shown. Typically, five masking steps are required to fabricate such an array (see, e.g., H. Kitahara et al., SID '00 Digest, pp.1108–1111). Vertical lines are data buses (lines) 10, horizontal lines are gate lines or buses 12. Extending from gate lines 12 is a region 14 where a TFT is fabricated (channel insulator layer and passivation layer are not shown for clarity and only conductors are shown in FIG. 1) for connecting data line 10 to a pixel electrode 16 when the TFT is enabled. Pixel electrode 16 is also connected to a storage capacitor 17 formed using the gate insulator between gate metal used for gate lines 12 and data metal used for data line 10 on an adjacent pixel's gate line. For the vertical stripe triad unit cell 8, as shown, a typical size would be in the range of 120 to 300 microns on a side. It should be understood that the dimensions indicated on FIGS. 1–5 are for illustrative purposes only, and should not be construed as limiting the present invention as other dimensions and aspect ratios are contemplated.

Figure 2:
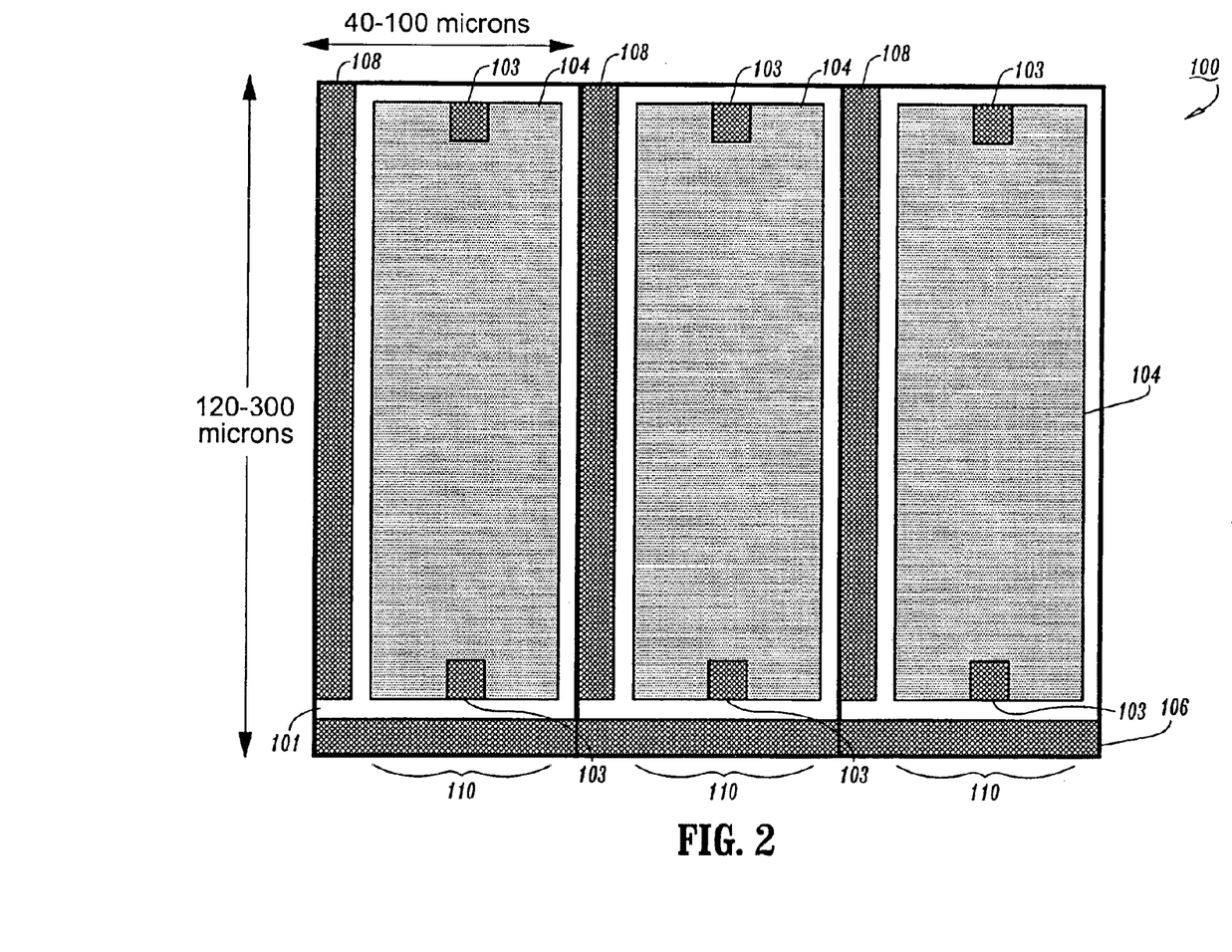
FIG. 2 is a top schematic view of a display substrate of an active matrix liquid crystal display (AMLCD) with addressing electrodes and pixel electrode formed with no active switching device in accordance with the present invention.

Referring to FIG. 2, a top view of an illustrative display substrate 100 is shown in accordance with one embodiment of the present invention. Display substrate 100 includes addressing electrodes (gate lines 106 and data lines 108) and pixel electrodes 104. To reduce costs of display substrate 100, one metal deposition and patterning step may be employed to fabricate both gate lines 106 and data lines 108 (e.g., same conductive layer for both gate lines 106 and data lines 108). In alternate embodiments, gate lines 106 and data lines 108 may be formed in different deposition and patterning steps or on different layers, as desired.

In this embodiment, data lines 108 are not continuous (gap 101); the data line segments 108 may be connected together and routed over gate lines 106 when chiplets (not shown) are attached in accordance with the present invention. Contacts 103 are provided to connect pixel electrode 104 to the active device and to the storage capacitor on the chiplet. For the case shown, storage capacitors are also formed on the chiplet (see also FIG. 5). However, it is also possible to extend pixel electrode 104 vertically under a previous gate line, deposit an insulator prior to depositing and patterning data/gate metal which is patterned to form gate lines 106 and data lines 108, and dry etch the insulator prior to removing the photoresist used for patterning gate lines 106 and data lines 108 so that a storage capacitor is formed between pixel electrode 104 and the previous gate line (e.g., the gate line of an adjacent pixel cell), and the insulator layer is also removed from over pixel electrode 104.

Pixel electrode 104 is preferably transparent and includes a transparent conductor material, such as indium tin oxide (ITO) or the like. The deposition of the transparent conductor and the patterning step may be needed to form pixel electrodes on display substrate 100. In one embodiment, gate lines 106, data lines 108 and pixel electrodes 104 may be formed in a single layer of transparent conductor material.

Gate lines 106 and data lines 108 are preferably formed from a material which is compatible with the metallurgy or material used for joining pads of the chiplets. Otherwise, a top metal film may be formed on the material which forms data lines 108 and gate lines 106 to achieve this compatibility. This may include an additional masking step to deposit and pattern compatible metallurgy for connecting to the joining pads on the chiplets.

Figure 3:
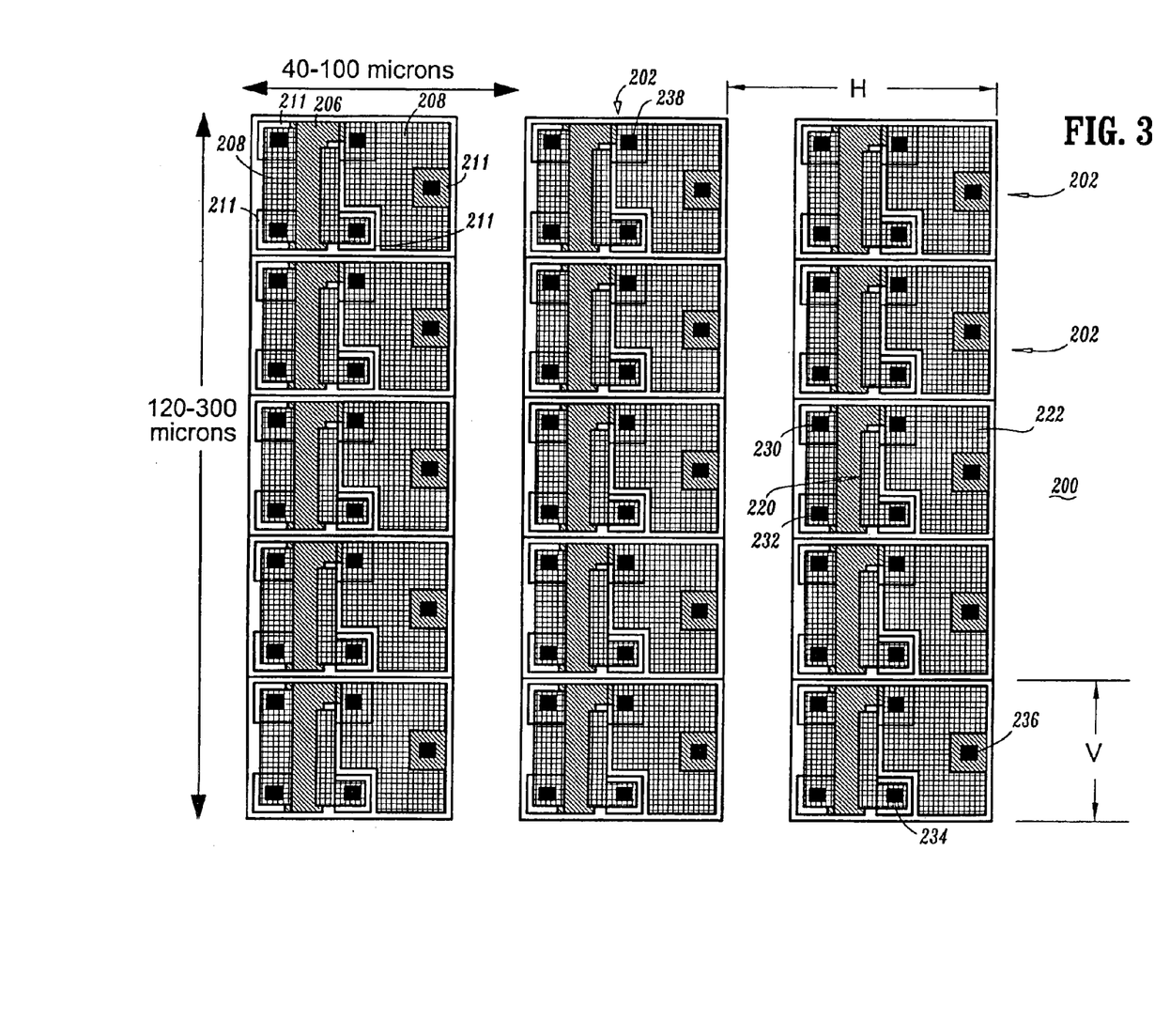
FIG. 3 is a top schematic view of a chiplet substrate showing an array of chiplets formed in accordance with the present invention.

Referring to FIG. 3, a top view of a chiplet substrate 200 is shown in accordance with one embodiment of the present invention. Substrate 200 includes active electrical devices or chiplets 202 which will be connected to each subpixel 110 (FIG. 2). A gate metal 206 (indicated by diagonal hatching) and a data metal 208 (indicated by horizontal and vertical cross-hatching) are shown along with dark squares 230–238 (see FIG. 5) showing the locations of openings in a passivation insulator layer 210 and a thick metal film 212, which extends to the concentric squares (indicated as 211) about the passivation opening, are used to join chiplets 202 to display substrate 100 (FIG. 1). For clarity, other features or components are omitted from chiplets 202 as depicted in FIG. 3.

For the case shown, 15 chiplets 202 can be fabricated in the same area as three subpixels 110 (FIG. 2). This is an example for a very high resolution display (about 180 pixels per inch (ppi)). For a lower resolution display such as 100 ppi (254 microns per side of each pixel), about 66 chiplets 202 could be fabricated in the same area occupied by three subpixels.

Figure 4:
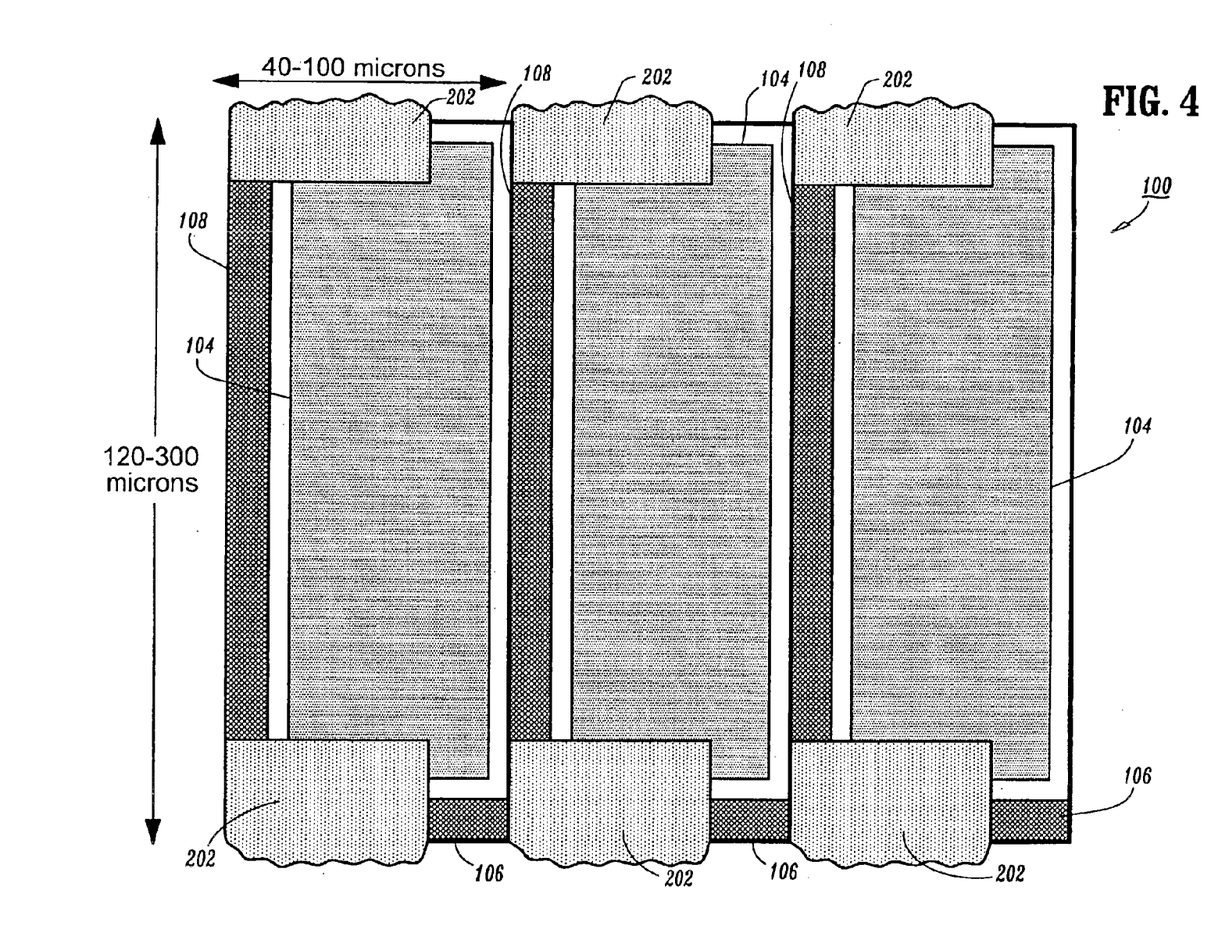
FIG. 4 is a top schematic view of chiplets joined to the display substrate shown in FIG. 2 in accordance with the present invention.

Referring to FIG. 4, individual chiplets 202 are assembled (face down) on display substrate 100 in accordance with the present invention. Each chiplet 202 includes a switching device (e.g., TFT 220 in FIG. 5). Each chiplet 202 may include storage capacitor (222 in FIG. 5), and provides vertical interconnection (224 in FIG. 5) for connection portions (or cross-over connections) of data lines 108.

The present invention may be applied to, for example, AMLCD displays, OLED displays or any other display or semiconductor device. In particular the present invention is preferably applied to any device having a need for active electrical devices in a repetitive pattern. If, for example, an OLED display is employed, additional addressing lines, such as at least one supply line would be needed along with the addition of at least one other TFT for addressing the OLED (see, e.g., Mizukami et al, SID '00 Digest pp. 912–915 and Inukai et al, SID '00 Digest pp. 924–927). In the case of an OLED, if light emitting material and a common top electrode were deposited on the display substrate and removed from the bond pad regions prior to attachment of the chiplets and if the pixel electrode and display substrate are transparent so that the light is emitted through the substrate, the light emitting area is independent of the chiplet size; it is only limited by the area occupied by the addressing electrodes and bond pads. (FIG. 4).

Figure 5:
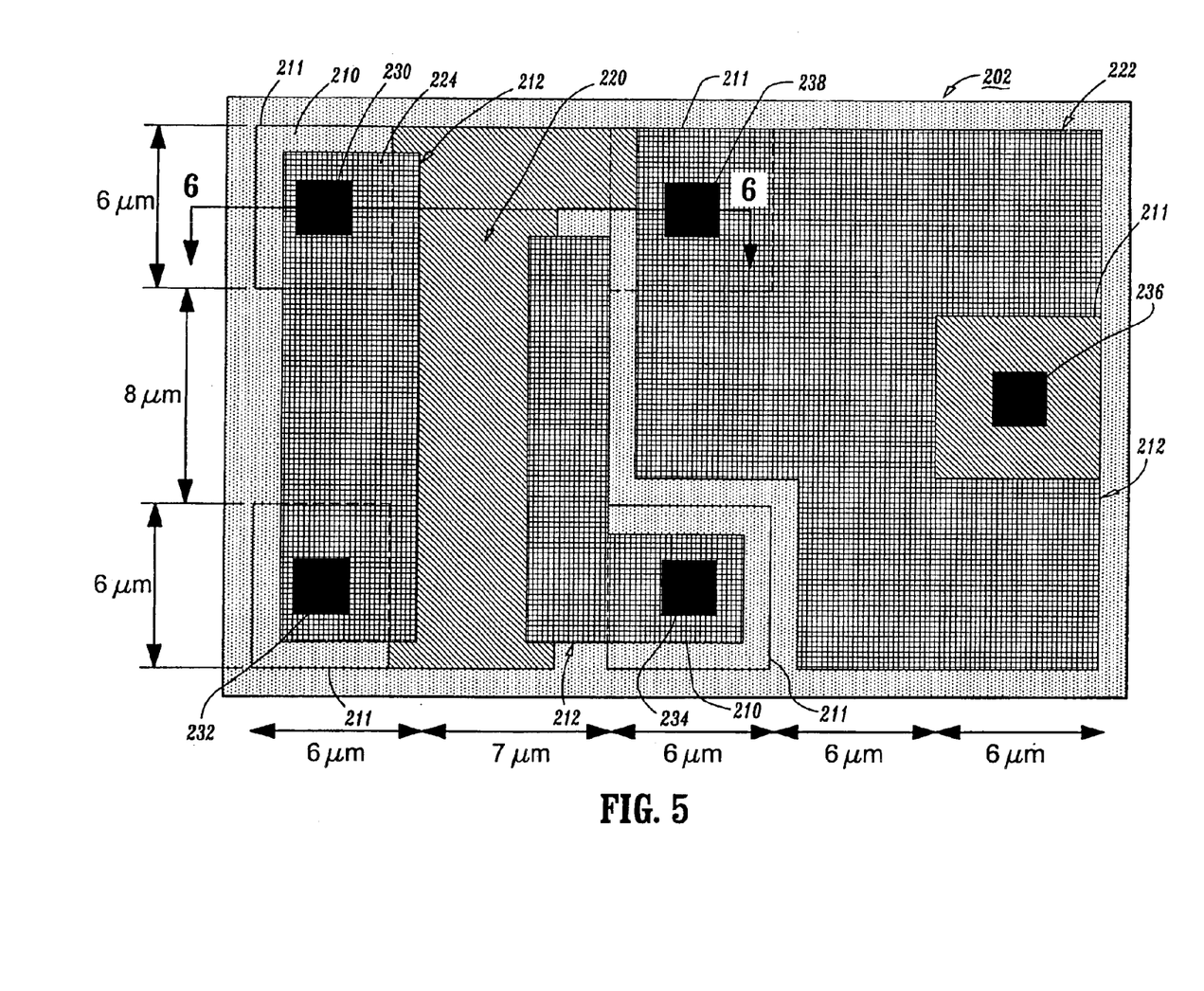
FIG. 5 is a top schematic view of an illustrative individual chiplet in accordance with the present invention.

Referring to FIG. 5, a top view schematic of a single chiplet 202 is shown in accordance with the present invention. A gate metal 206 (indicated by diagonal hatching) and a data metal 208 (indicated by vertical and horizontal hatching) are shown along with dark squares 230–238 showing the locations of openings in passivation insulator layer 210 and a thick metal film or other conductive material 212 used to join chiplets 202 to display substrate 100 (e.g., shown as concentric squares 211 around the passivation openings) (FIG. 2). Contacts or connects 230 and 232 provide vertical connections between data line segments 108 (FIG. 2) and connect data line 108 to TFT 220. Connection 234 connects an output of TFT 220 to pixel electrode 104. Connection 236 connects one side of storage capacitor 222 to gate line 106 (FIG. 2), and connection 238 connects a next pixel electrode 104 (of an adjacent pixel cell) to a data metal electrode of storage capacitor 222. Note that the gate metal extends under storage capacitor 222 and connects a gate of TFT 220 with connect 236. In one embodiment, joining pads or connections 230, 232, 234, 236 and 238 are illustratively shown as about 6 microns by about 6 micron pads with a minimum space of about 7 microns between pads. Other pads sizes and spacings are also contemplated. Storage capacitor 222 is formed by the overlap of gate and data metals on one side of the chiplet.

Figure 6:
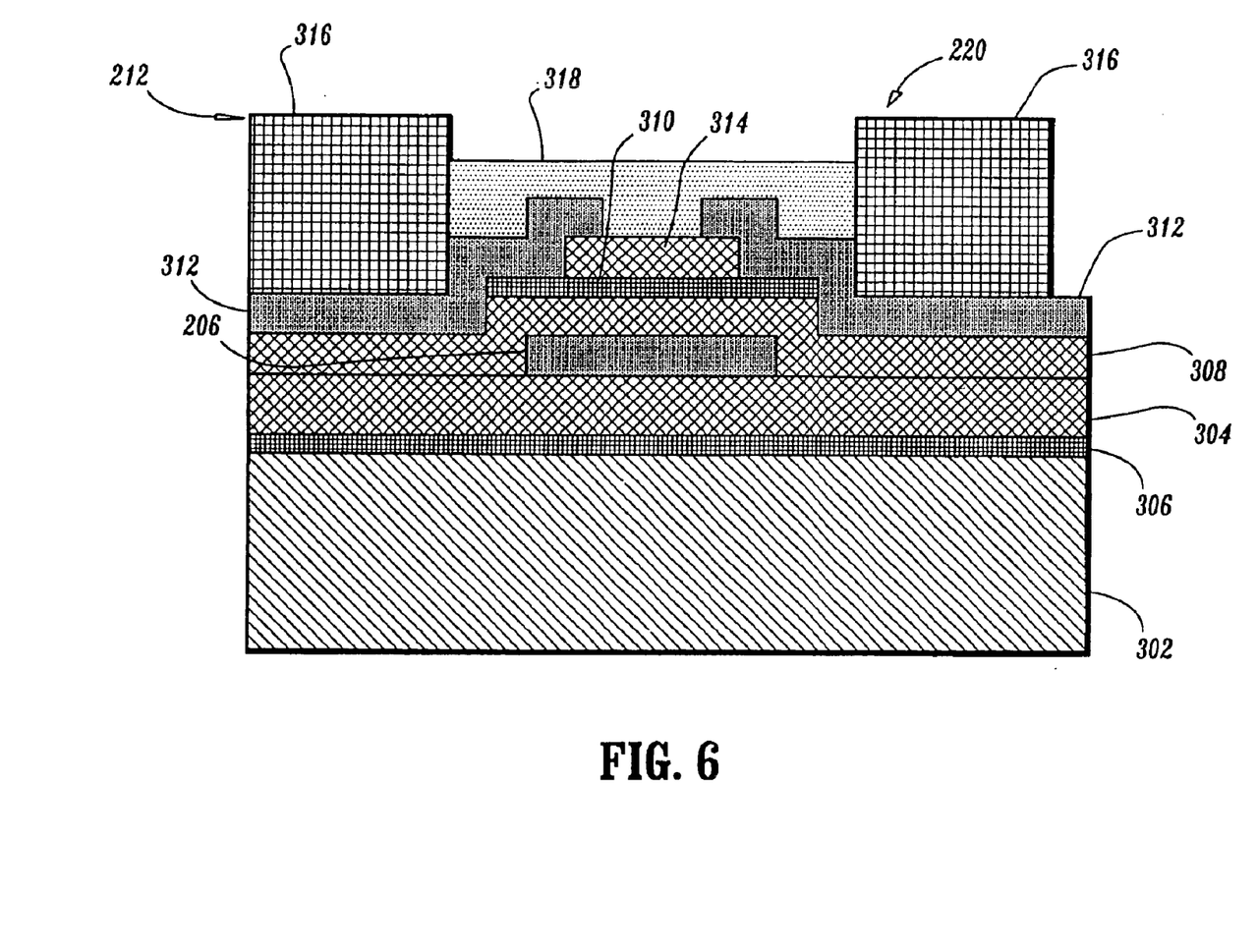
FIG. 6 is a cross-sectional view of a thin film transistor (TFT) chiplet device taken at section line 6—6 of FIG. 5 in accordance with the present invention.

Referring to FIG. 6, a cross-sectional view of TFT 220 on chiplet 202 is shown. An underlayer insulator 304 (which maybe significantly thicker than shown) and a parting layer 306, for example, amorphous silicon, are deposited on a substrate 302. Substrate 302 preferably includes glass or other transparent material. Gate metal 206 has a gate insulator 308 formed thereon. A semiconductor layer 310, such as an amorphous silicon layer, is formed over gate insulator 308 and forms a channel region of TFT 220. An I-stop layer 314 (a dielectric layer including, for example, silicon dioxide or silicon nitride) is patterned on semiconductor layer 310. Ohmic source and drain contacts 312, using for example, Mo/Al/Mo on highly doped amorphous silicon, are formed on gate insulator 308, semiconductor layer 310 and I-Stop layer 314. Joining pads 316 connect to ohmic source and drain contacts 312 to provide connections between TFT 220 and display substrate 100 (FIG. 2). A passivation layer 318 insulates portions of TFT 220.

In the case of a liquid crystal display (LCD), LCDs include two substrates, a first substrate which may include pixel electrodes 104. In accordance with the invention, the first substrate preferably includes chiplets 220. A second substrate may include a counter electrode and a color filter layer, for example. These two substrates are spaced by a gap which is filled with liquid crystal material. The thickness of chiplet 220 (including joining pads 316 (e.g., connections 230–238)) is preferably less than or equal to a thickness of the liquid crystal cell gap (e.g., the thickness of the liquid crystal layer between substrates). Alternately, the substrate, on which a counter electrode and color filters are formed, needs to include depressions where chiplets 220 are located to accommodate any thickness beyond that of the cell gap. Note that although amorphous Si TFTs have been described, the same processes and methods could be used with polycrystalline silicon devices or any other type transistor structure, if such devices are more suitable for the desired chiplet properties.

Thick metal film 212 for joining chiplets may include, for example, a low melting point solder, such as, 66% In-34% Bi (melting point=72 degrees C.), 57% Bi-26% In-17% Sn (melting point=79 degrees C.), 54% Bi-30% In-16% Sn (melting point=81 degrees C.), 67% Bi-33% In (melting point=109 degrees C.), 52% In-48% Sn (melting point=118 degrees C.), 58% Bi-42% Sn (melting point=138 degrees C.), 97% In-3% Ag (melting point=143 degrees C.), 100% In (melting point=157 degrees C.) and others. These solder materials are non-toxic (e.g., Pb-free and Cd-free) and melt at relatively low temperatures compatibles with the processing of, for example, organic materials used in display fabrication.

Thick metal film 212 may be a composite of a conductive barrier layer and a low melting point solder and may be formed on only one substrate or on both substrates. Pads of different materials or composites may be formed on each substrate. A combination of pressure and/or heat and/or ultrasonic vibrations may be employed to form the electrical contact/attachment (e.g., bond). The bonding and connections are not limited to solder materials or connections. Joins may be provided by employing ductile metals, such as, for example, gold and tin, and applying any one or more of heat, pressure and/or ultrasonic vibrations. Thermocompressive or other conductive adhesive bumps may also be employed.

Examples of suitable electrically conductive adhesives are disclosed in U.S. Ser. Nos. 08/641,406; 08/883,188; 60/052,172, 08/868,771 and 08/877,991, all of which are assigned to International Business Machines Corporation, the assignee of the present application, and incorporated herein by reference.

These electrically conductive paste materials comprise conducting filler particles dispersed in a matrix of thermoplastic and/or thermoset polymer resin optionally with other ingredients, for example, no-clean solder flux. The electrically conducting adhesive may include a conducting fusible coating with at least some of the conducting particles being fused to other conducting particles through the electrically conductive fusible coating.

Figure 7:
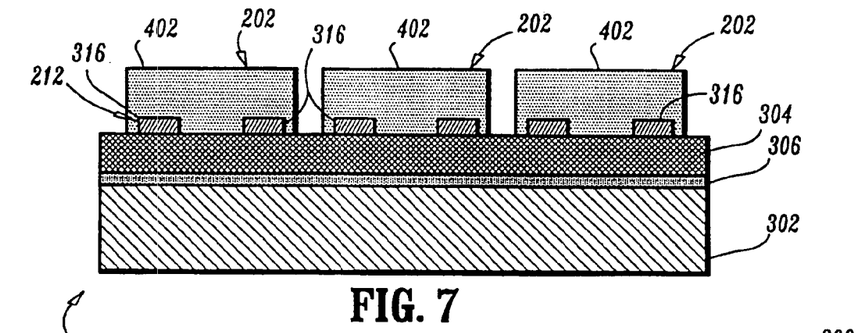
FIG. 7 is a cross-sectional view of a chiplet release process showing photoresist formed on a chiplet substrate to pattern trenches to separate the individual chiplets in accordance with the present invention.

Referring now to FIGS. 7–14, a process for separation, transfer, alignment, and attachment of chiplets 202 from a chiplet substrate 200 to a display substrate 100 (FIG. 1) is shown in accordance with the present invention. Referring to FIG. 7, chiplet substrate 200 is shown. Chiplet substrate 200 includes underlayer insulator 304 and metal film 212 for joining pads 316 for individual chiplets 202. Other components and layers are omitted for clarity. Photolithography is used to pattern a thick photoresist layer 402 on substrate 200. Photoresist 402 is patterned to expose the regions between chiplets 202 to define chiplets which are to be removed.

Figure 8:
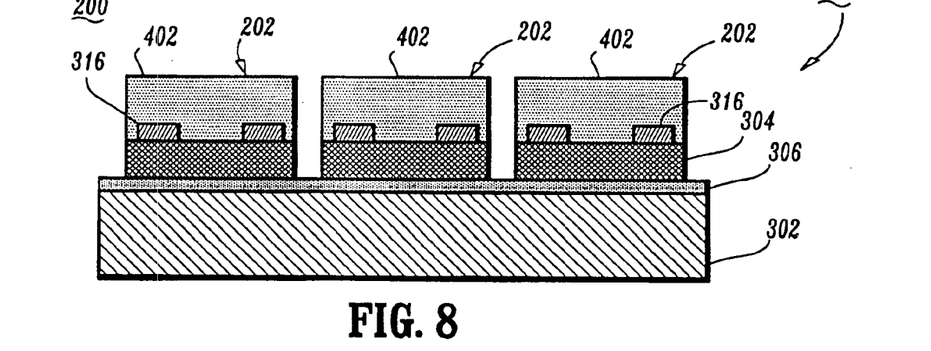
FIG. 8 is a cross-sectional view showing an underlayer insulator patterned by etching to expose a parting layer in accordance with the present invention.

Referring to FIG. 8, underlayer insulator 304 is etched by an anisotropic etch process, such as, reactive ion etching (RIE), stopping on, or past, parting layer 306. It is desirable to use a directional RIE process to minimize the width of material removed between chiplets 202. With an isotropic etch, such as a wet etch, the width of the region etched at the top surface of the display substrate would be at least the width of the opening in the photoresist plus twice the thickness of the underlayer insulator.

Figure 9:
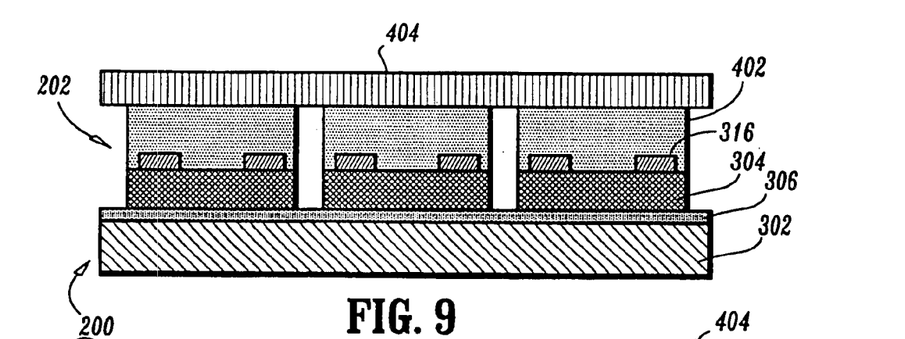
FIG. 9 is a cross-sectional view showing an attachment of a porous transfer plate to the photoresist on top of the chiplets in accordance with the present invention.

Referring to FIG. 9, a transfer plate 404 is brought into contact with photoresist layer 402 on chiplets 220. Either heat, pressure, or exposure to solvent vapors may be employed to cause the photoresist layer 402 to adhere somewhat to transfer plate 404. Transfer plate 404 may be porous to improve adhesion to photoresist layer 402. Alternately, transfer plate 404 may be coated with a compliant and slight adhesive material, such as a pressure sensitive adhesive, and photoresist layer 402 may be removed from the top of chiplets 202 prior to attachment to transfer plate 404.

Figure 10:
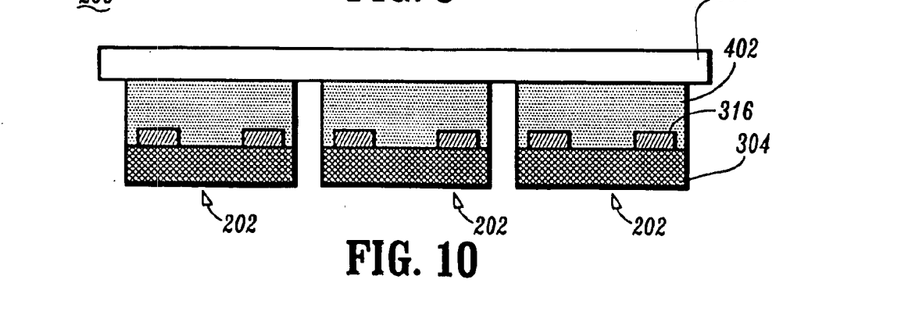
FIG. 10 is a cross-sectional view showing the removal of the parting layer and the chiplet substrate in accordance with the present invention.

Referring to FIG. 10, chiplets 202 are released from chiplet substrate 200 and remain adhered to porous transfer plate 404 (by, e.g., vacuum and/or adhesive). One way of achieving separation of chiplets 202 from substrate 200, if parting layer 306 is amorphous Si includes performing an etch process to etch away parting layer 306. The etch process may include a vapor phase etch with, for example, $XeF_2$, which may be introduced through the porous transfer plate 404. In an alternate embodiment, releasing the chiplets 202 may be performed by laser ablation of a sacrificial amorphous layer. (See, e.g., Utsunomiya et al, SID '00 Digest, pp.916–919). If laser ablation is employed, transfer plate 404 does not need to be porous.

Chiplets 202 on chiplet substrate 200 preferably include a chiplet spacing in both the vertical and horizontal directions which is an integer fraction of the spacing of subpixels 140. For example, as shown in FIG. 3, the horizontal chiplet spacing "H" equals the subpixel pitch and in the vertical direction, chiplet spacing "V" is ⅕ of the pixel pitch. Spacings H and V are illustrative and may be adjusted depending on the resolution of the display and depending on the particular sizes of chiplets and pixel/sub-pixel pitch.

Figure 11:
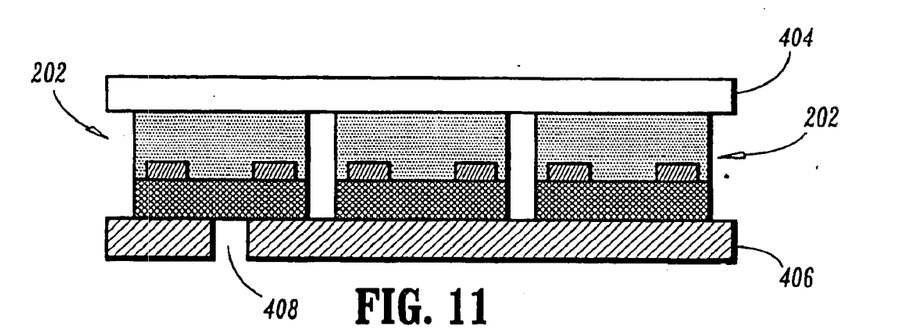
FIG. 11 is a cross-sectional view showing a selective transfer plate in contact with chiplets attached to the porous transfer plate in accordance with the present invention.

Referring to FIG. 11, a selective transfer plate 406 is employed to detach and hold selected chiplets 202 from the porous transfer plate 404. In one embodiment, selective transfer plate 406 includes a plurality of holes 408 in predetermined locations corresponding to chiplets 202 to be removed from transfer plate 404. A vacuum is applied to a back surface 410 of chiplet 202 through hole 408. The force applied to hold chiplet 202 on selective transfer plate 406 preferably exceeds the adhesive force holding chiplets 202 on porous transfer plate 404. In this way, chiplets 202 can be lifted off from transfer plate 404 when plates 404 and 406 are moved apart (FIG. 12).

For the case of vacuum applied through holes 408, selective transfer plate 406 removes, for example, every 5th horizontal row of chiplets 202 from porous transfer plate 404. In the example, the pattern of holes 408 through selective transfer plate 406 provides a chiplet pattern as shown in FIG. 4. Other mechanisms (other than vacuum) for lifting off and holding chiplets 202 may include electrostatic or magnetic forces to hold chiplets 202 on selective transfer plate 406 if appropriate materials are added into the chiplet structure.

Figure 12:
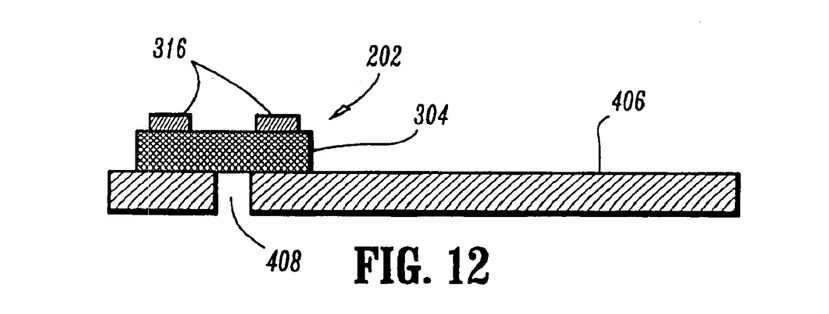
FIG. 12 is a cross-sectional view showing the selective transfer plate with a selected chiplet attached after the photoresist layer has been removed from the top surface of the chiplet in accordance with the present invention.

Referring to FIG. 12, photoresist 402 from the top surface of chiplets 202 is removed by a solvent strip, ozone ash, or other removal processes (if photoresist 402 still remains on the top surface of chiplets 202). Selective transfer plate 406 continues to hold chiplets 202 throughout the photoresist strip process.

Figure 13:
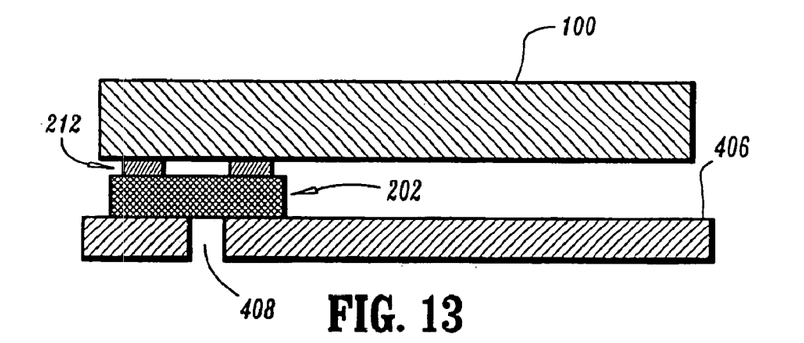
FIG. 13 is a cross-sectional view showing the alignment and bonding of the chiplet to the display substrate in accordance with the present invention.

Referring to FIG. 13, chiplets 202 on selective transfer plate 406 are aligned to display substrate 100 using either transparent regions of selective transfer plate 406 or through display substrate 100 if it is transparent. Once chiplets 202 are correctly aligned (see e.g., FIG. 4), metal film 212 and contact points on display substrate 100 are brought into contact and pressure and/or heat and/or ultrasonic vibrations are use to form an electrical contact to attach and connect chiplets 202 to display substrate 100. If a solder or a low melting point metal or alloy is used for joining, after selective transfer plate 406 has been removed, the display substrate and chiplets can be heated to melt the bonding metal so that surface tension pulls the chiplets into an exact alignment. Additionally, if such a bond is used, rework can be accomplished by heating an individual chip, with an infrared (IR) heater for example, removing it, and attaching a new chiplet.

Figure 14:
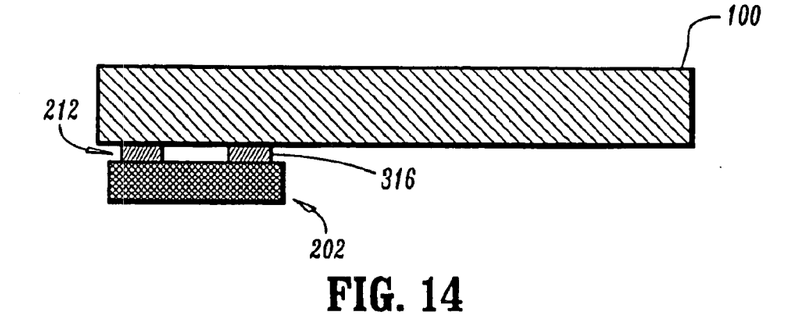
FIG. 14 is a cross-sectional view showing a chiplet attached to the display substrate after the chiplet has been released from the selective transfer plate and the selective transfer plate is removed in accordance with the present invention.

After chiplets 202 have been bonded to the display substrate, selective transfer plate 406 is cooled, if it was heated, and air pressure is applied instead of vacuum to release chiplets 202 from selective transfer plate 406, and selective transfer plate 406 is removed as shown in FIG. 14.

Figure 15:
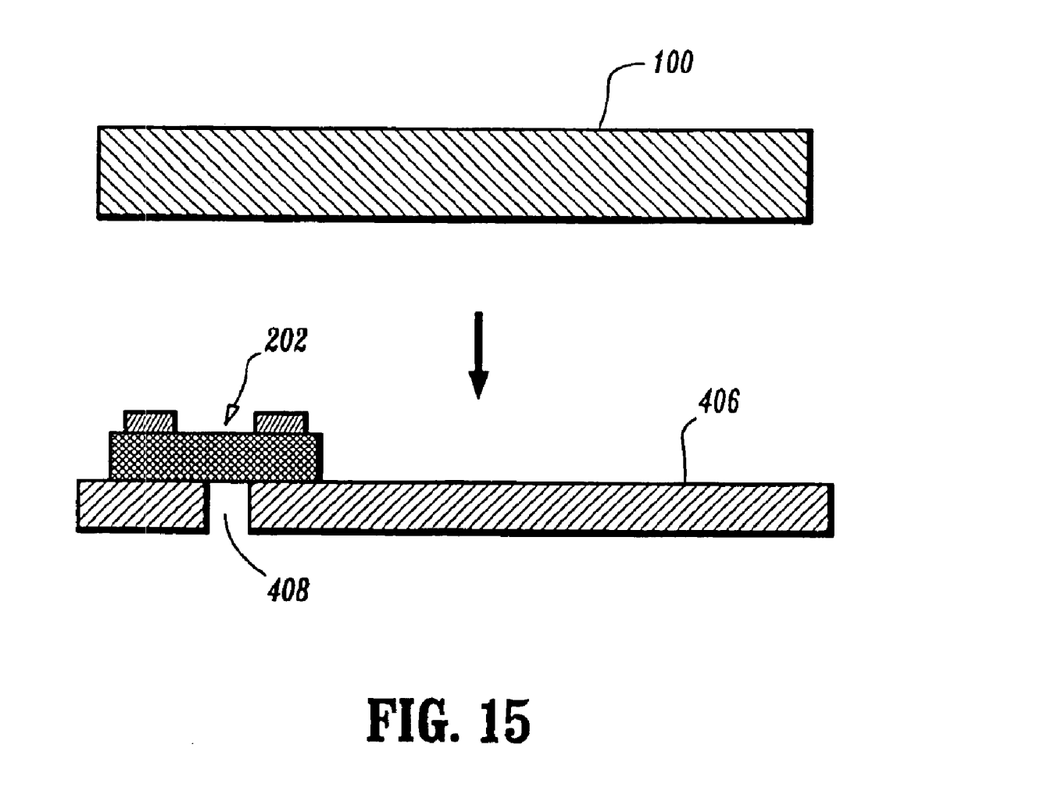
FIG. 15 is a cross-sectional view showing a chiplet disconnected from the display substrate for rework in accordance with the present invention.

It is to be understood that selective transfer plate 406 may be used to transfer, align, and bond a single chiplet or multiple chiplets from porous transfer plate 404 to display substrate 100 at one time. An area of selective transfer plate 406 may be populated with chiplets for a full display, a partial display, or multiple displays. In addition, selective transfer plate 406 may carry selected patterns of chiplets, for example, to replace failed or misaligned chiplets. FIG. 15 shows a chiplet 202 being removed from display substrate 100 to perform a repair.

Having described preferred embodiments of a display fabrication using modular active devices (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A display device, comprising:

gate lines and data lines patterned from a single layer of conductive material;

pixel electrodes formed in operative relationship with the gate lines and data lines; and a plurality of chiplets connected to the gate lines, the data lines and the pixel electrodes such that the chiplets activate the pixel electrodes in accordance with the gate lines and the data lines.

2. The display device as recited in claim 1, wherein the display device includes one of an active matrix liquid crystal display and an organic light emitting diode display.

3. The display device as recited in claim 1, wherein the plurality of chiplets are connected to the gate lines, the data lines and the pixel electrodes by conductive attachments.

4. The display device as recited in claim 3, wherein the conductive attachments include at least one of solder bumps, conductive adhesive bumps and thermocompression bond pads.

5. The display device as recited in claim 1, wherein the plurality of chiplets provide a cross-over connection between data line segments.

6. The display device as recited in claim 1, wherein the chiplets each include a transistor which is connected to at least a data line and a gate line.

7. The display device as recited in claim 1, wherein the chiplets each include a storage capacitor.

8. The display device as recited in claim 1, wherein the chiplets include a size related to a fraction of sub-pixel size for sub-pixels of the display device.

* * * * *